United States Patent [19]
Fujii et al.

[11] Patent Number: 5,661,319
[45] Date of Patent: Aug. 26, 1997

[54] SEMICONDUCTOR DEVICE HAVING CAPACITOR

[75] Inventors: Eiji Fujii; Yasuhiro Shimada; Yasuhiro Uemoto, all of Osaka; Tooru Nasu, Kyoto; Akihiro Matsuda; Tatsuo Ootsuki, both of Osaka, all of Japan

[73] Assignee: Matsushita Electric Industrial Co., Ltd., Osaka, Japan

[21] Appl. No.: 681,093

[22] Filed: Jul. 22, 1996

Related U.S. Application Data

[62] Division of Ser. No. 397,737, Mar. 2, 1995, abandoned, which is a continuation of Ser. No. 76,356, Jun. 14, 1993, abandoned.

[30] Foreign Application Priority Data

Jun. 18, 1992 [JP] Japan ................................. 4-159222
Jun. 25, 1992 [JP] Japan ................................. 4-167309
Oct. 16, 1992 [JP] Japan ................................. 4-278380

[51] Int. Cl.$^6$ ............................ H01L 27/108; H01G 7/06
[52] U.S. Cl. ........................... 257/295; 257/306; 257/310; 365/145; 365/149
[58] Field of Search ...................... 257/295, 303, 257/306–310, 532, 347, 350; 365/145, 149

[56] References Cited

U.S. PATENT DOCUMENTS

| | | | |
|---|---|---|---|
| 5,053,917 | 10/1991 | Miyasaka et al. | 257/310 |
| 5,187,638 | 2/1993 | Sandhu et al. | 257/310 |
| 5,206,788 | 4/1993 | Larson et al. | 257/295 |
| 5,229,309 | 7/1993 | Kato | 257/295 |
| 5,241,211 | 8/1993 | Tashiro | 257/347 |
| 5,281,837 | 1/1994 | Kohyama | 257/310 |
| 5,293,075 | 3/1994 | Onishi et al. | 257/310 |
| 5,313,089 | 5/1994 | Jones, Jr. | 257/295 |
| 5,519,234 | 5/1996 | Paz de Arauso | 257/295 |

FOREIGN PATENT DOCUMENTS

| | | | |
|---|---|---|---|
| 0046868 | 3/1982 | European Pat. Off. . | |
| 0415751 | 3/1991 | European Pat. Off. . | |
| 0256358 | 11/1991 | Japan | 257/295 |
| 0072778 | 3/1992 | Japan | 257/295 |
| 0206871 | 7/1992 | Japan | 257/295 |

OTHER PUBLICATIONS

Translation of Japan Kokai Publication #04–0206871 to Veda et al., 11 pages.
Translation of Japan Kokai Publication #04–0072778 to Iwamatsu, 3 pages.
*IEEE Journal of Solid–State Circuits*, 24:1, pp. 165–173, "Low–Voltage Coefficient Capictors For VLSI Processes", Slater and Paulos (Feb. 1989).

*Primary Examiner*—Peter Toby Brown
*Attorney, Agent, or Firm*—Amster, Rothstein & Ebenstein

[57] ABSTRACT

This is a semiconductor device having an integrated circuit and a capacitor formed on a semiconductor substrate. The capacitor comprises a bottom electrode serving also as a part of a diffusion layer of the integrated circuit, a dielectric film being formed on the bottom electrode, and a top electrode of a conductive film being formed on the dielectric film. In particular, it is preferred to form the dielectric film in two layers of dielectric film, and compose the dielectric film contacting with the bottom electrode of a dielectric material in a composition possessing an excess of a metal element than the stoichiometric composition.

10 Claims, 10 Drawing Sheets

SEMICONDUCTOR DEVICE HAVING CAPACITOR

This application is a divisional of application Ser. No. 08/397,737 filed on Mar. 2, 1995 now abandoned, which is a continuation of Ser. No. 08/076,356, filed Jun. 14, 1993 and also abandoned.

FIELD OF THE INVENTION

The present invention relates to a semiconductor device having capacitor using a dielectric film possessing a high dielectric constant such as ferroelectric film.

BACKGROUND OF THE INVENTION

Recently, the features such as spontaneous polarization and high dielectric constant of ferroelectric film have attracted interest in the field of the integrated circuit, and intensive efforts have been concentrated on research and development for application of the ferroelectric film into nonvolatile random access memory (RAM) and dynamic RAM (DRAM) of high degree of integration. In particular, lately, the DRAM having capacitor using dielectric film of high dielectric constant is being rapidly developed for achieving necessary capacity and simplifying the complicated cell structure of DRAM.

Concerning a conventional semiconductor device having capacitor, an example of memory cell of DRAM is explained below.

Figure 10:
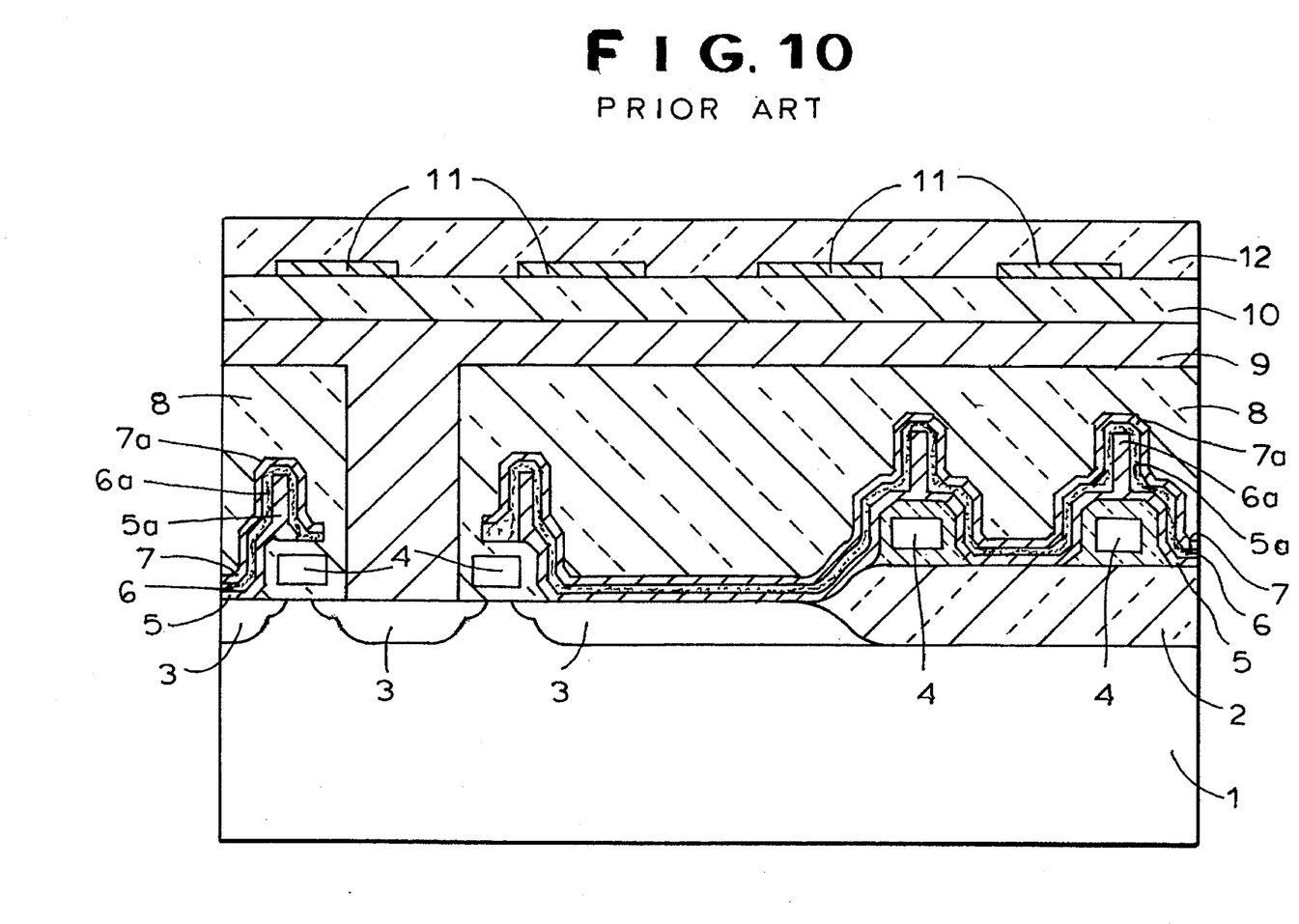
FIG. 10 is a partly sectional schematic view of a conventional semiconductor device.

FIG. 10 is a sectional view of this memory cell. In FIG. 10, numeral 1 denotes a silicon substrate, 2 is a field oxide film (LOCOS film), 3 is an N$^+$ diffusion layer composing the source or the drain of transistor, and 4 is a word line composed of polycide film or polycrystalline silicon film. Numeral 5 is a bottom electrode made of polycrystalline silicon film connected to the diffusion layer 3, 6 is a dielectric film laminating silicon nitride film and silicon dioxide film, and 7 is a top electrode composed of polycrystalline silicon film, and a capacitor is composed of these films. Meanwhile, 5a, 6a and 7a are bumps of the bottom electrode 5, dielectric film 6, and top electrode 7, respectively. Numeral 8 is a first interlayer insulating film, 9 is a first wiring for bit line made of polycide film or aluminum alloy film, 10 is a second interlayer insulating film, 11 is a second wiring made of aluminum alloy film, and 12 is a protector film.

The memory cell of DRAM is usually composed of one transistor and one capacitor. The memory cell of a conventional DRAM is very complicated in structure because the capacitor having a necessary capacity is formed in a fine memory cell region. That is, as shown in FIG. 10, projecting portions 5a, 6a, 7a are formed in order to increase the capacity to cope with widening of the total area of the capacitor. Such conventional constitution, however, involved the following problems.

First of all, since the dielectric film 6 of the capacitor in the memory cell is formed in a laminate film of silicon nitride film (relative dielectric constant about 7.5) and silicon dioxide film (relative dielectric constant about 3.9), the relative dielectric constant is small. Therefore, to form a capacitor possessing a capacity necessary for memory action, the structure and manufacturing process of the capacitor are very complicated. For example, to realize a DRAM of 65 megabits, a capacity of 30 fF is required in a memory region of about 1.5 µm$^2$. Accordingly, when the conventional laminate film of silicon nitride film and silicon dioxide film is used as dielectric film 6, if the dielectric film 6 is reduced to a thickness of 5 nm as converted to silicon dioxide, the projecting portion 5a of the bottom electrode must be built up to a height of 1.5 µm. To form such high projecting portion, it requires a complicated manufacturing process comprising many process steps. Besides, leak currents are present in the junction area between P-type well and the N$^+$ diffusion layer of transistors for composing memory cell and in the dielectric film for composing the capacitor. Therefore, the refreshing cycle necessary for holding the memory data of the memory cell depend on these leak currents, it is difficult to decrease the total area of the capacitor without shortening the refresh cycle.

SUMMARY OF THE INVENTION

An embodiment of the invention presents a semiconductor device comprising an integrated circuit and a capacitor formed on a substrate, wherein the capacitor comprises a bottom electrode serving also as the diffusion layer of the integrated circuit, a dielectric film possessing a high dielectric constant formed on a surface of the substrate containing the upper part of the diffusion layer, and a top electrode of a conducting film formed on the dielectric film.

Other embodiment presents a semiconductor device having a capacitor comprising a bottom electrode formed on an interlayer insulating film of an integrated circuit, a dielectric film possessing a high dielectric constant, and a top electrode, wherein the diffusion layer of the integrated circuit and the bottom electrode are connected through a conducting film filling up the contact hole provided in the interlayer insulating film.

Another embodiment presents a semiconductor device having a capacitor comprising a bottom electrode of at least one layer of conducting film formed on a surface of the substrate containing a part of diffusion layer of an integrated circuit, a dielectric film possessing a high dielectric constant formed on a surface of the substrate including the upper part of the bottom electrode, and a top electrode made of a conducting film formed on the dielectric film.

In these constitutions, by using a dielectric film possessing a high dielectric constant with the relative dielectric constant of 200 or more as the dielectric constant for composing the capacitor, since the relative dielectric constant is about 40 times larger as compared with that of the conventional laminate film of silicon nitride film and silicon dioxide film, a required capacity may be realized by a small capacitive area. In addition, the hitherto very complicated constitution and manufacturing method of capacitor may be notably simplified.

Or, when ferroelectric films such as lead titanate (PbTiO$_3$), PZT (PbZr$_{1-x}$Ti$_x$O$_3$ $0 \leq x \leq 1$) and PLZT (Pb$_{1-y}$La$_y$Zr$_{1-x}$Ti$_x$O$_3$ $0 \leq x \leq 1$ $0 \leq y \leq 1$) are used as dielectric films, it is possible to realize a nonvolatile memory capable of holding the data even after cutting off the power owing to the spontaneous polarization of the ferroelectric film.

DESCRIPTION OF THE PREFERRED EMBODIMENTS

Embodiment 1

Figure 1:
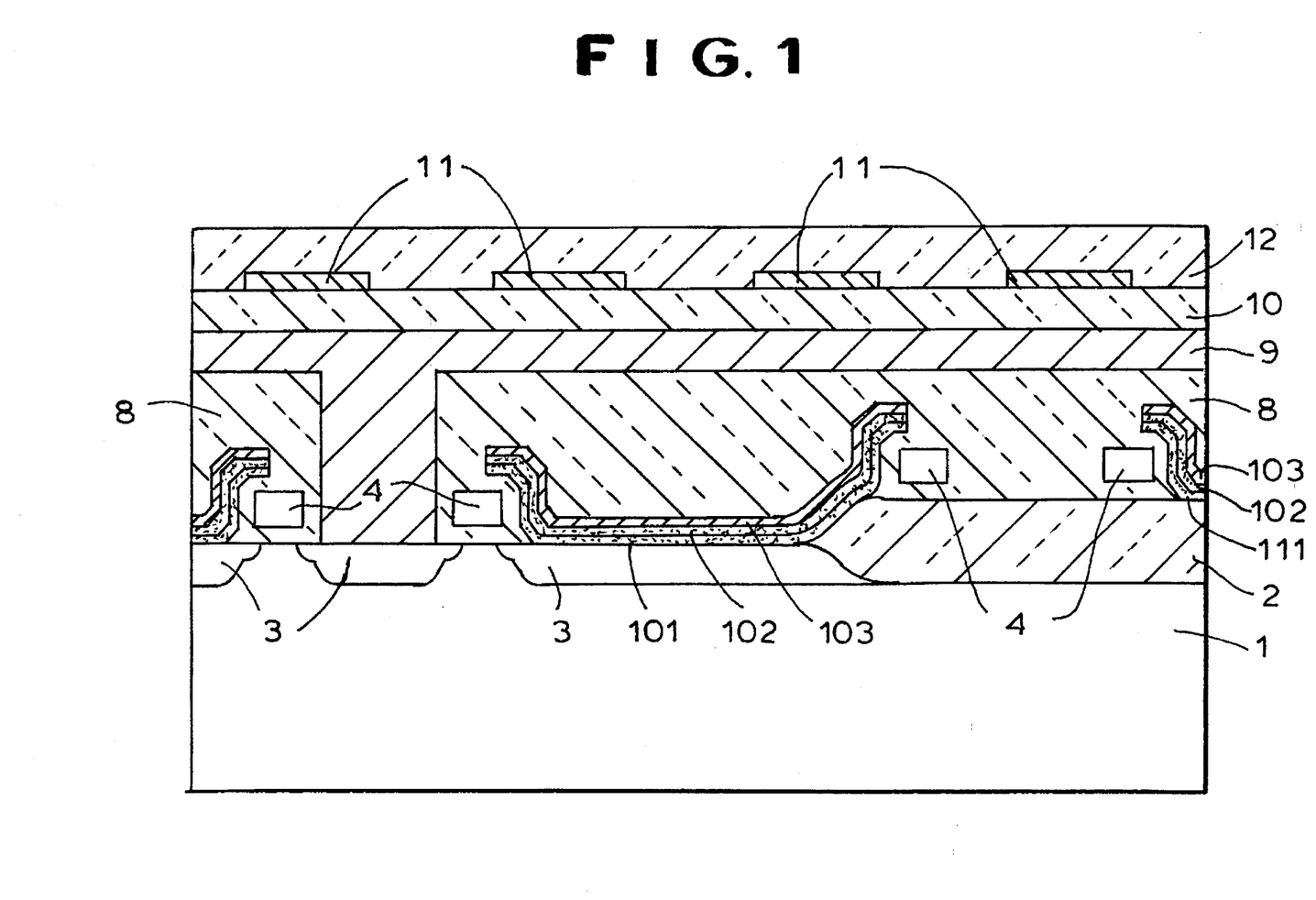
FIG. 1 is a partly sectional schematic view of a semiconductor device in a first embodiment of the invention.

FIG. 1 is a sectional view showing the structure of a memory cell region of DRAM. In FIG. 1, the parts same as in the prior art in FIG. 10 are identified with same reference numbers and their explanations are omitted. In FIG. 1, numeral 101 denotes a dielectric film of $Ba_{1-x}Sr_xTi_yO_3$ ($0 \leq x \leq 1$, $y > 1$) containing Ti in excess of stoichiometric composition, 102 is a dielectric film of $Ba_{1-x}Sr_xTiO_3$ ($0 \leq x \leq 1$) in stoichiometric composition, and 103 is a top electrode composed of platinum film.

In this embodiment, the capacitor is formed by holding a laminate film of Ti-excess dielectric film 101 and dielectric film 102 in stoichiometric composition between the diffusion layer 3 serving also as the bottom electrode and the top electrode 103. Titanium contained in excess in the dielectric film 101 reacts, on one hand, with the spontaneous oxide film formed on the diffusion layer 3, and reacts with silicon to form a silicide compound, thereby lowering the contact resistance. On the other hand, it is also effective to improve the fitting of the dielectric film 102. Besides, by lowering the contact resistance and using the material of high dielectric constant, the total area of the capacitor may be reduced. In the capacitor, the conventional projecting portions are not needed, and the manufacturing process may be simplified.

Instead of the $Ba_{1-x}Sr_xTiO_3$ film of the embodiment, a dielectric film mainly composed of tantalum such as tantalum oxide ($Ta_2O_5$) and lithium tantalate ($LiTaO_3$), or a dielectric film mainly composed of tungsten such as tungsten oxide and tungsten-bronze may be preferably used. In such case, since tantalum or tungsten relatively easy to oxidize, tantalum oxide or tungsten oxide may be easily formed on the interface with the diffusion layer 3. These oxides act as diffusion barrier film to prevent diffusion of silicon, the substrate material, into the dielectric film. As a result, furthermore, the composition in the dielectric film changes continuously, so that abrupt lowering of dielectric constant may be suppressed.

Incidentally, the two dielectric films 101, 102 may not be always same dielectric materials, and they may be made of different materials, such as the dielectric film 101 made of Ti-excess barium-strontium titanate and the dielectric film 102 made of lead titanate.

Furthermore, in the embodiment, the dielectric film 101 and dielectric film 102 are formed separately. However, the same object may be achieved by continuous dielectric films formed by controlling the supply titanium content and supplying the titanium excessively in the portion contacting with the diffusion layer 3 when forming the film by CVD method or sputtering method.

In this embodiment, the capacitor is formed on the semiconductor substrate, but the capacitor may be also formed on a semiconductor film formed on an insulating substrate or on a semiconductor thin film formed on the semiconductor substrate through an insulating layer.

Embodiment 2

Figure 2:
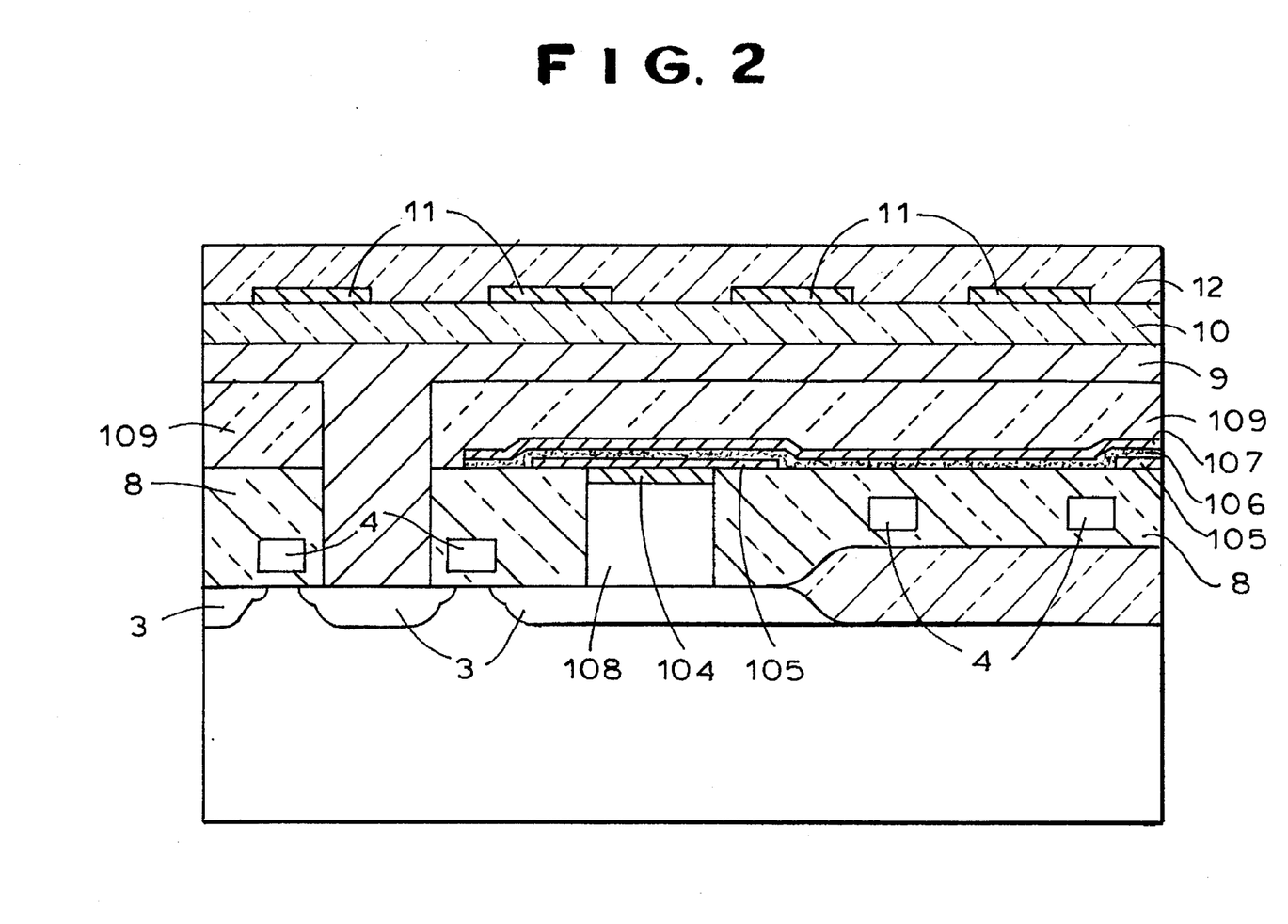
FIG. 2 is a partly sectional schematic view of a semiconductor device in a second embodiment of the invention.

FIG. 2 is a sectional view showing the constitution of a memory cell region of other DRAM. In FIG. 2, the parts same as in the prior art in FIG. 10 are identified with same reference numbers and their explanations are omitted. In FIG. 2, numeral 104 denotes a barrier layer composed of titanium nitride (TiN), 105 is a bottom electrode made of platinum film, 106 is a dielectric film of $Ba_{1-x}Sr_xTiO_3$, 107 is a top electrode made of platinum film, 108 is a polycrystalline silicon buried in the contact hole of a first interlayer insulating film 8 made of silicon dioxide film, and 109 is a third interlayer insulating film.

In the embodiment, the polycrystalline silicon 108 is buried in the contact hole of the first interlayer insulating film 8 formed on the semiconductor substrate, and therefore the dielectric film 106 may be formed on the relatively flat bottom electrode 105. Hence, as compared with the undulated surface of the substrate, the dielectric film 106 possesses an excellent film thickness uniformity, and it is possible to reduce the film thickness furthermore in order to raise the capacity per unit area. In addition, since the barrier layer 104 is formed between the bottom electrode 105 and polycrystalline silicon 108, it is possible to suppress the reaction between the polycrystalline silicon 108 and bottom electrode 105 in high temperature process such as heat treatment during formation of the dielectric film 106.

Embodiment 3

Figure 3:
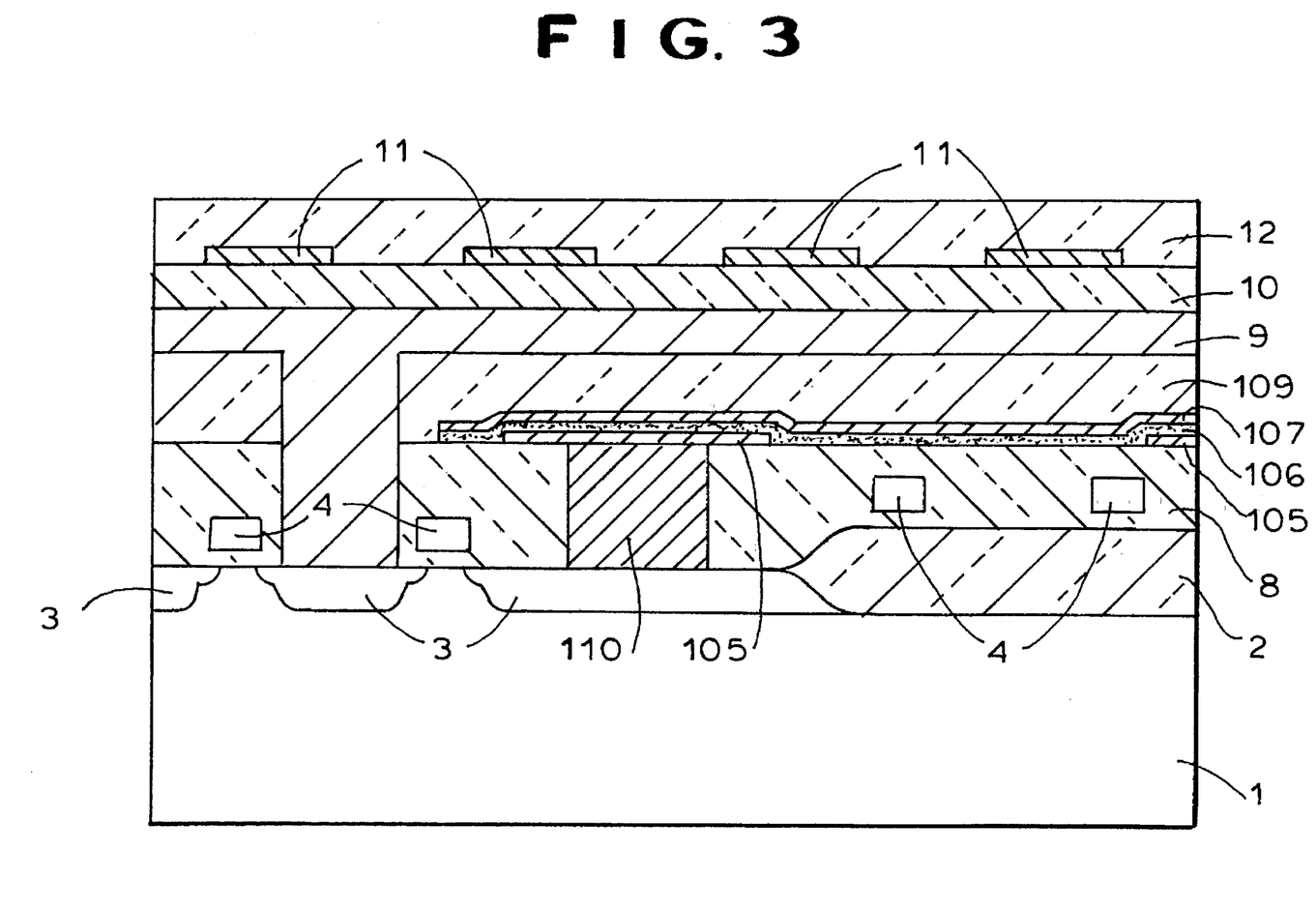
FIG. 3 is a partly sectional schematic view of a semiconductor device in a third embodiment of the invention.

FIG. 3 is a sectional view showing the constitution of a memory cell region of a DRAM modified from Embodiment 2.

The difference of Embodiment 3 from Embodiment 2 shown in FIG. 2 is that a titanium nitride film 110 buried in the contact hole is directly connected to the diffusion layer 3. In this embodiment, too, the dielectric film 106 can be formed on a relatively flat bottom electrode 105, and the dielectric film 106 possesses an excellent film thickness uniformity. Further, since the bottom electrode 105 and diffusion layer 3 are connected with the titanium nitride film 110, it is possible to suppress the reaction between the bottom electrode 105 and diffusion layer 3 in high temperature process such as heat treatment during formation of the dielectric film 106.

Embodiment 4

Figure 4:
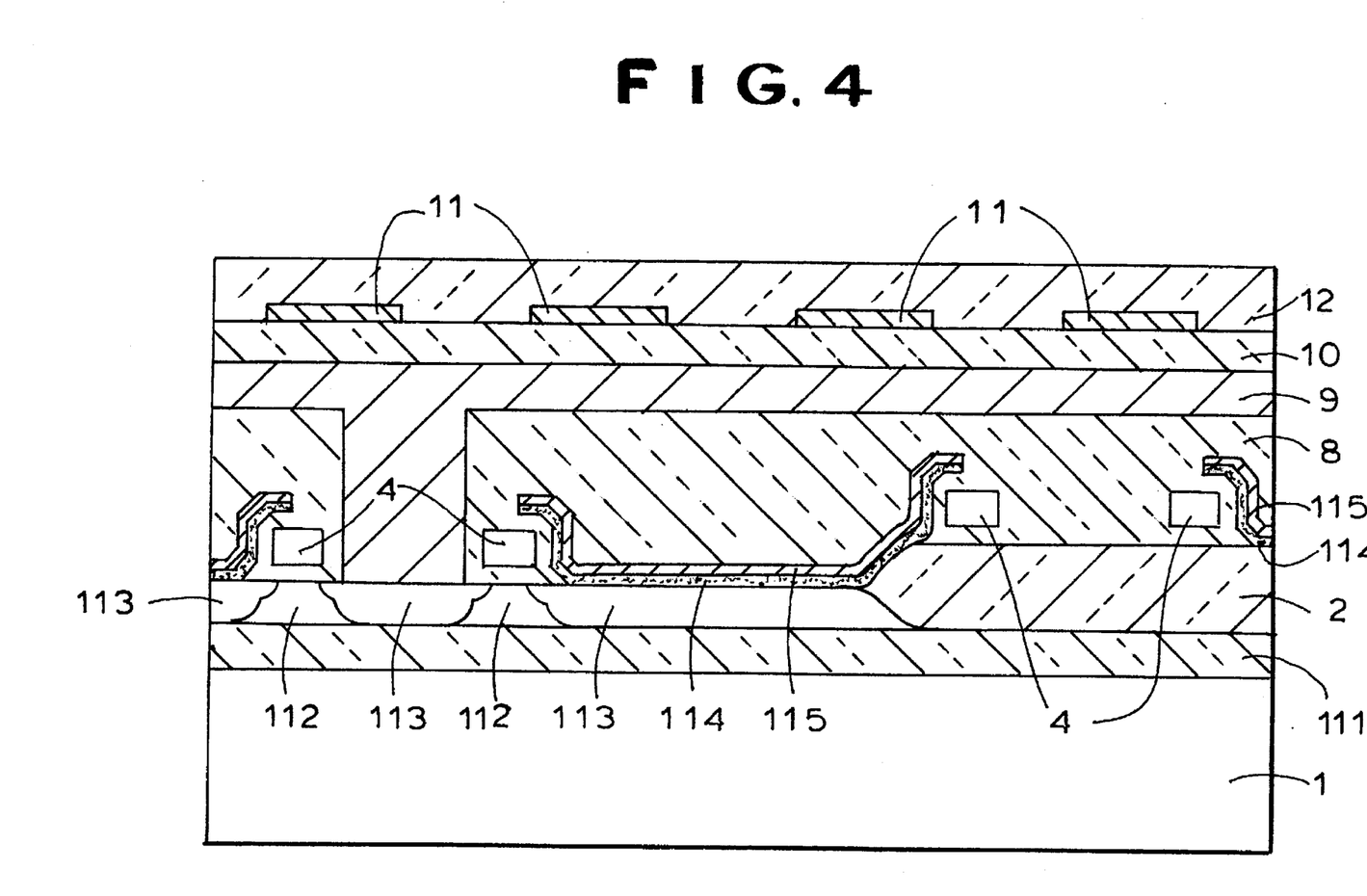
FIG. 4 is a partly sectional schematic view of a semiconductor device in a fourth embodiment of the invention.

FIG. 4 is a sectional view showing the constitution of a memory cell region in a different DRAM. In FIG. 4, the parts same as in the prior art in FIG. 10 are identified with same reference numbers and their explanations are omitted. In FIG. 4, numeral 111 is a buried silicon dioxide film formed by ion implantation of oxygen at high energy and high dose rate, 112 is a single crystal silicon thin film formed on the buried silicon dioxide film 111, 113 is a diffusion layer formed in the single crystal silicon film 112, 114 is a dielectric film composed of $Ba_{1-x}Sr_xTiO_3$, and 115 is a top electrode made of platinum film.

In this embodiment, transistors are formed in the single crystal silicon film 112 insulated and separated from the silicon substrate 1 by the buried silicon dioxide film 111, and the well forming process required in the conventional CMOS type semiconductor device is not necessary. Besides, by using the dielectric film 114 possessing a high dielectric constant, the structure of the capacitor can be formed extremely simply and flatly, and the manufacturing process is notably curtailed, and improvement of yield is expected. Still more, the junction area of the N⁺ type diffusion layer and P-type well is decreased in the transistor to which the capacitor is connected, and the junction leak current is significantly decreased, and the leak current in the memory cell can be decreased only to the leak current of the dielectric film 114 of the capacitor. Therefore, the cycle of the refreshing action necessary for holding the memory data of the memory cell can be extended, and the refreshing current may be decreased.

Embodiment 5

Figure 5:
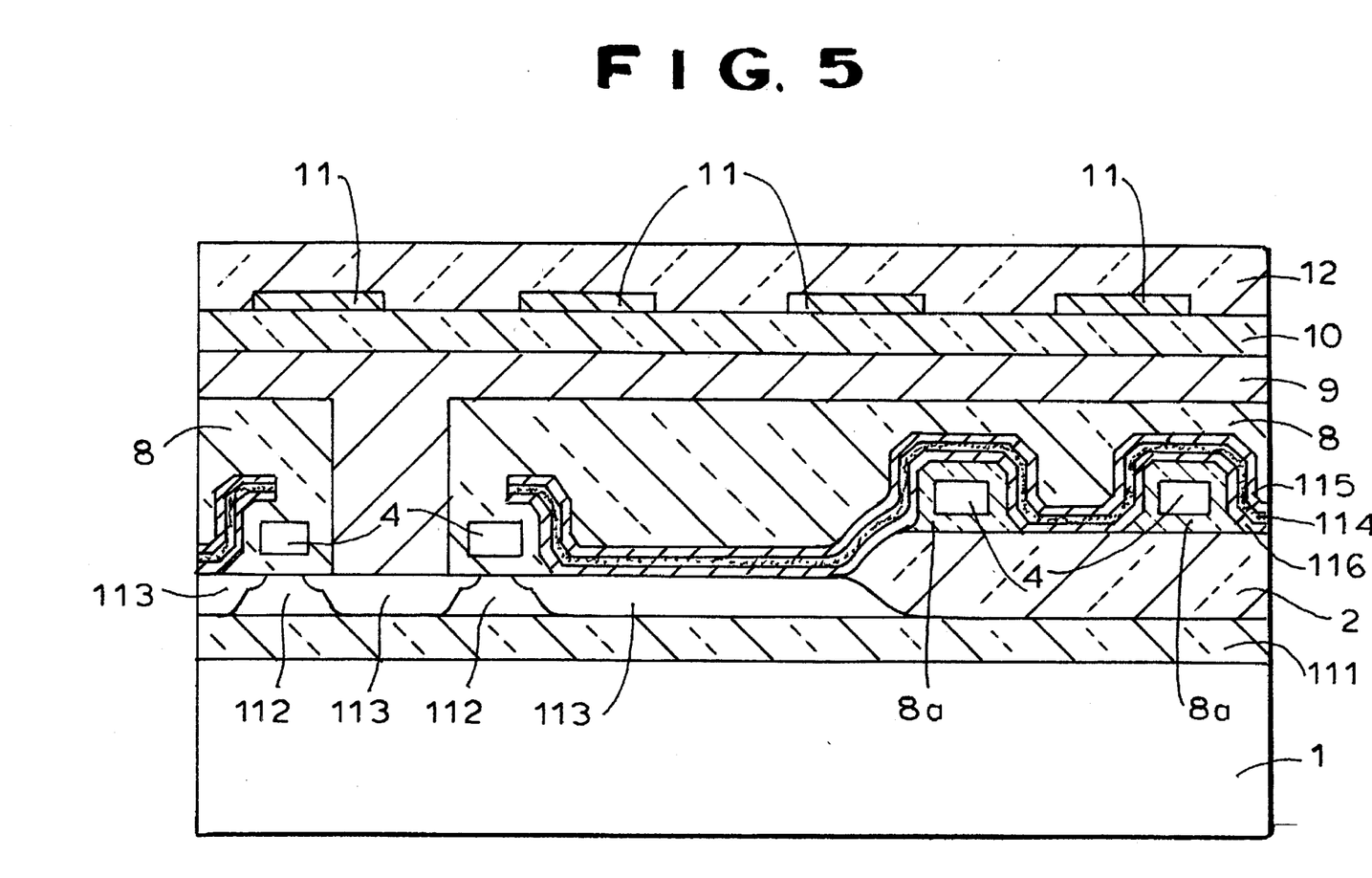
FIG. 5 is a partly sectional schematic view of a semiconductor device in a fifth embodiment of the invention.

FIG. 5 is a sectional view showing the constitution of a memory cell region of a DRAM modified from Embodiment 4. What differs from Embodiment 4 in FIG. 4 is that a bottom electrode 116 sequentially laminating a titanium film, titanium nitride (TiN) film and platinum film is inserted between the N⁺ type diffusion layer 113 to be used as the source or drain of the transistor and dielectric film 114. In this embodiment, the titanium film reacts with silicon by heat treatment to form silicide, and adhesion with the N⁺ diffusion layer 113 is enhanced. Besides, since the dielectric film 114 is an oxide, if contacting directly with the N⁺ type diffusion layer 113, the surface of the N⁺ type diffusion layer 113 is oxidized by heat treatment at high temperature, but by inserting titanium film, the surface is not oxidized if heated at high temperature. The titanium nitride film acts as barrier film to prevent diffusion of platinum film into the diffusion layer 113.

Thus, by using a laminate film of titanium, titanium nitride and platinum in the bottom electrode, heat treatment at high temperature is possible in the process after forming the dielectric film 114. Accordingly, highly reliable first interlayer insulating film 8 and protector film 12 can be easily formed.

In this embodiment, too, same as in Embodiment 4, it is possible to simplify the device structure, shorten the manufacturing process notably, improve the yield, extend the refreshing action cycle, and decrease the refreshing current.

Embodiment 6

Figure 6:
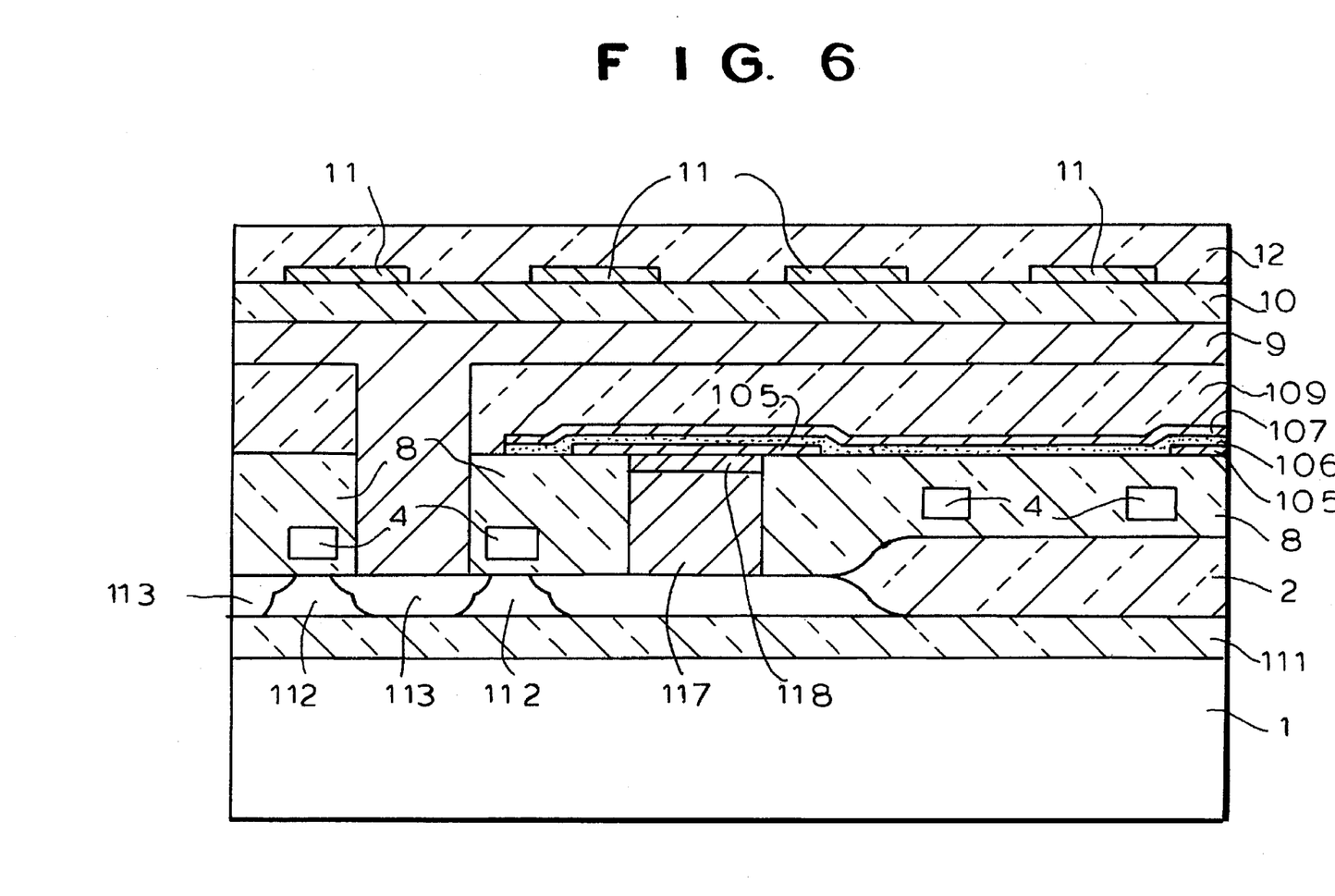
FIG. 6 is a partly sectional schematic view of a semiconductor device in a sixth embodiment of the invention.

FIG. 6 is a sectional view showing the constitution of a memory cell region of a DRAM similar to the DRAM shown in FIG. 2 and FIG. 4. In FIG. 6, the parts same as those shown in FIG. 2 and FIG. 4 are identified with same reference numbers, and their explanations are omitted. In FIG. 6, numerals 117 and 118 are titanium film and titanium nitride film buried in the contact hole provided in the silicon dioxide film 8.

In the embodiment, since the laminate film composed of titanium film 117 and titanium nitride film 118 is buried in the contact hole, the dielectric film 106 of $Ba_{1-x}Sr_xTiO_3$ can be formed on the relatively flat bottom electrode 105, and the capacitor high in capacity in shape can be realized. Besides, the titanium film 117 reacts with the diffusion layer 113 by heat treatment to form titanium silicide, and the contact resistance is lowered. Further, the titanium nitride film 118 acts as barrier film for preventing the platinum from diffusing into the diffusion layer 113 by heat treatment at high temperature in the process after forming the dielectric film 106. Hence, the third interlayer insulating film 109, second interlayer insulating film 10 and protector film 12 of high reliability can be formed.

Embodiment 7

Figure 7:
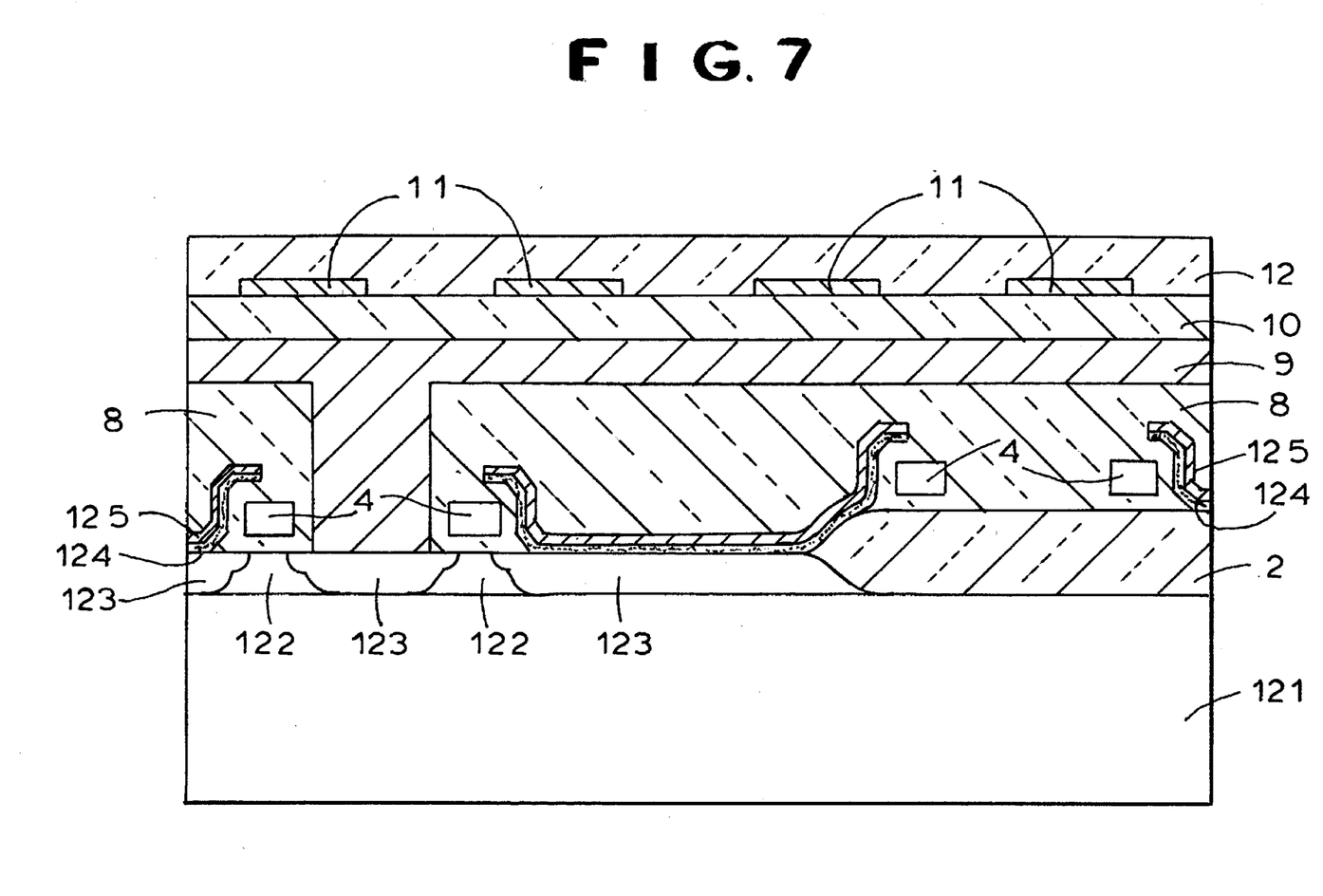
FIG. 7 is a partly sectional schematic view of a semiconductor device in a seventh embodiment of the invention.

FIG. 7 is a partly sectional schematic view of a semiconductor device having a capacitor. In FIG. 7, the same parts as in the prior art shown in FIG. 10 are identified with same reference numbers, and their explanations are omitted. In FIG. 7, numeral 121 denotes an insulating substrate made of quartz, 122 is a single crystal silicon thin film formed on the insulating substrate 121, 123 is a diffusion layer formed in the single crystal silicon film 122, 124 is a dielectric film composed of $Ba_{1-x}Sr_xTiO_3$, and 125 is a top electrode made of platinum.

In this embodiment, a selective transistor is formed on the single crystal silicon film 122 formed on the insulating substrate 121, and the well forming process required in the conventional CMOS semiconductor device is not necessary. Moreover, by using the dielectric film 124 possessing a high dielectric constant, a capacitor of a large capacity can be formed in a small area, simply and flatly.

Embodiment 8

Figure 8:
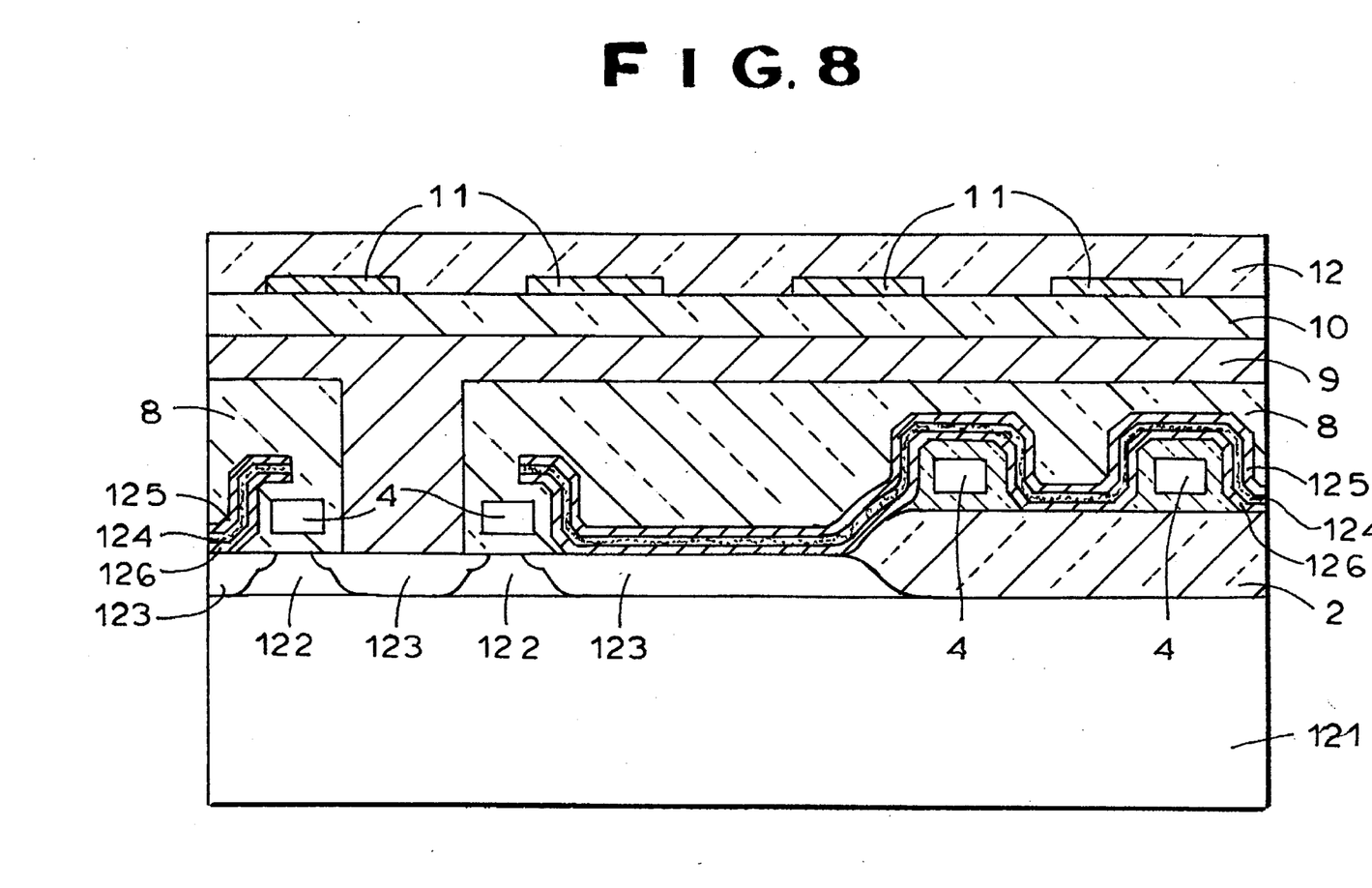
FIG. 8 is a partly sectional schematic view of a semiconductor device in an eighth embodiment of the invention.

FIG. 8 is a partly sectional schematic view of a semiconductor device modified from Embodiment 7. What differs from Embodiment 7 shown in FIG. 7 is that a bottom electrode 126 sequentially laminating, from the bottom, a titanium film, titanium nitride (TiN) film, and platinum film is inserted between the N⁺ type diffusion layer 123 as the source or drain of the transistor and the dielectric film 124. Therefore, same as in Embodiment 5, high temperature heat treatment in the process after forming the dielectric film 124 is possible, and therefore the first interlayer insulating film 8 and protector film 12 of high reliability may be easily formed.

Embodiment 9

Figure 9:
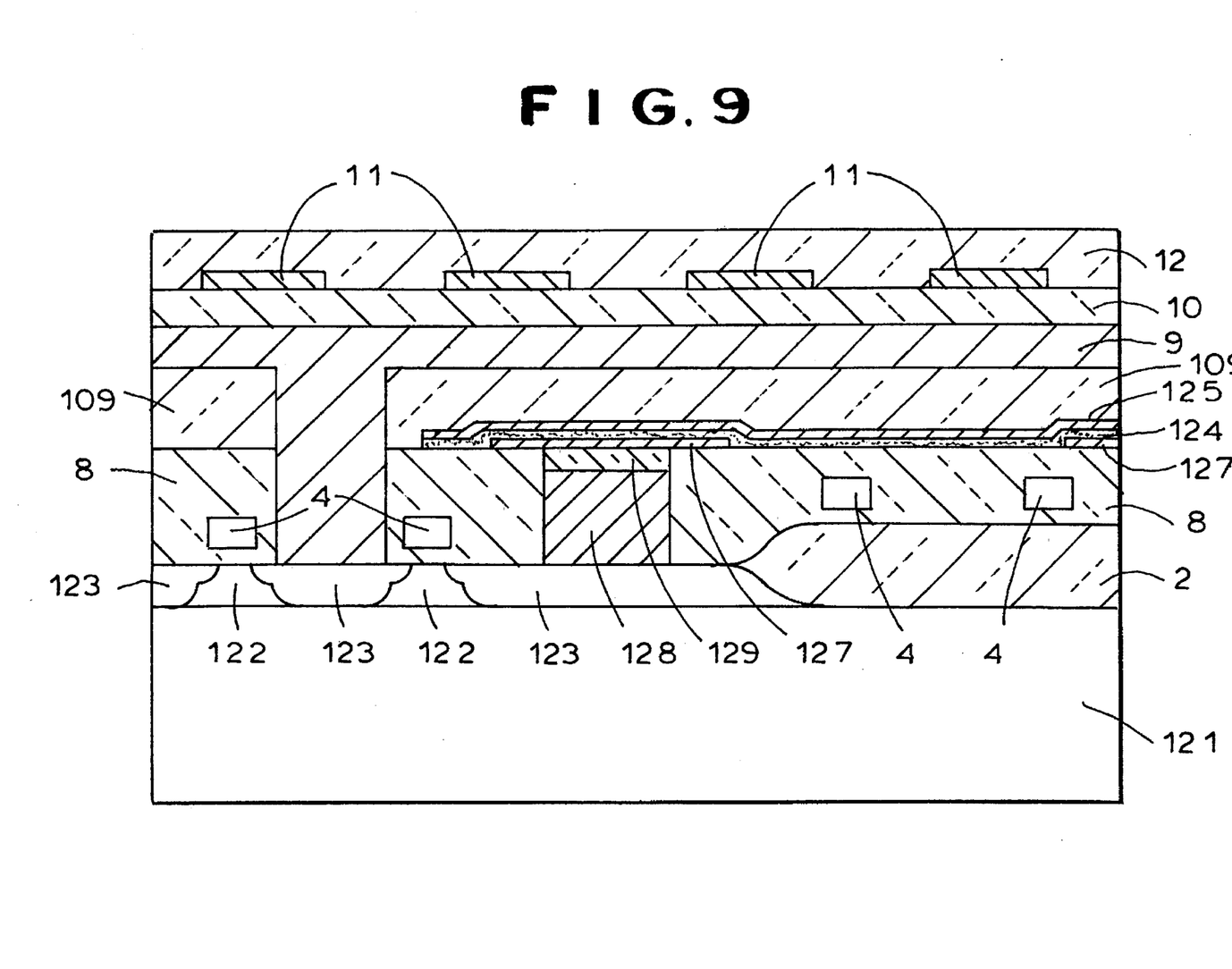
FIG. 9 is a partly sectional schematic view of a semiconductor device in a ninth embodiment of the invention.

FIG. 9 is a partly sectional schematic view of a semiconductor device modified from Embodiment 8. What differs from Embodiment 8 shown in FIG. 8 is that a bottom electrode 127 made of platinum film and diffusion layer 123 are connected through a laminated film of a titanium film 128 and titanium nitride film 129 buried in the contact hole of the second interlayer insulating film 8, and that a third interlayer insulating film 109 is formed thereon.

In the embodiment, since the titanium film 128 and titanium nitride film 129 are buried in the contact hole, the dielectric film 124 can be formed on the relatively flat bottom electrode 127, so that a highly reliable capacitor in shape can be realized. Besides, the titanium film 128 reacts with the diffusion layer 123 to form titanium silicide, thereby lowering the contact resistance. Moreover, the titanium nitride film 129 acts as barrier film for preventing diffusion of platinum into the diffusion layer 123 due to heat treatment at high temperature in the process after forming the dielectric film 124. Thus, highly reliable third interlayer insulating film 109, second interlayer insulating film 10 and protector film 12 may be formed.

In the invention, needless to say, various modifications are possible aside from the illustrated embodiments. For example, in Embodiments 2 through 9, the dielectric film possessing a high dielectric constant is a film of $Ba_{1-x}Sr_xTiO_3$, but the invention is not limited to this alone. Various materials such as lead titanate, PZT, PLZT, bismuth titanate, tantalum oxide, and others are also included in the invention.

Similarly, the top electrodes in Embodiments 1 through 9 and the bottom electrodes in Embodiments 3, 6 and 9 are made of platinum film, but the invention allows to use other materials, including metal films of high melting point such as palladium, tungsten, tantalum, titanium, nickel and chromium, their alloy films, their oxide conductive films such as silicide film, indium-tin oxide (ITO), and rhenium oxide, nitride conductive films such as titanium nitride, and their laminated films.

Embodiments 4 through 6 relate to examples of a substrate having a single crystal silicon film on the oxide film formed by ion implantation of high energy and high dose rate of oxygen on the silicon substrate, and the same effects are obtained by the substrate forming a silicon single crystal film after oxidizing the silicon substrate.

Examples of DRAM are shown in Embodiments 1 through 6, but the invention is, needless to say, generally applicable to semiconductor devices such as a nonvolatile RAM making use of the spontaneous polarization and another semiconductor device having capacitor.

Hence, all modifications falling within the true spirit and scope of the invention are included in the claims of the invention.

What is claimed is:

1. A semiconductor device comprising:

a substrate;

an integrated circuit and a capacitor formed on said substrate;

said capacitor including a bottom electrode which is a diffusion layer of said integrated circuit; a first dielectric layer formed on said diffusion layer, said first dielectric layer composed of a non-stoichiometric metal oxide composition in which said metal is in excess of stoichiometric composition; a second dielectric layer formed on said first dielectric layer; and a top electrode formed on said second dielectric layer.

2. The semiconductor device of claim 1, wherein said substrate is selected from the group consisting of (1) a semiconductor substrate; (2) a substrate which comprises a semiconductor substrate, an insulating layer formed thereon and a semiconductor layer formed on said insulating layer; and (3) an insulating substrate having a semiconductor layer formed thereon.

3. The semiconductor device of claim 1, wherein said metal element is selected from the group consisting of titanium, tantalum and tungsten.

4. The semiconductor device of claim 1, wherein said second dielectric layer possesses a relative dielectric constant of at least 200.

5. A semiconductor device comprising:

a substrate;

an integrated circuit and a capacitor formed above said substrate;

said capacitor including a bottom electrode which is a diffusion layer of said integrated circuit; a dielectric layer formed on said diffusion layer, said dielectric layer being an oxide composition containing a metal element and possessing a compositional distribution in which a portion of said dielectric layer which is in contact with said diffusion layer contains an amount of said metal element in excess of an amount of said metal element in a remaining portion of the dielectric layer, said remaining portion having a stoichiometric composition; and a top electrode formed on said dielectric layer.

6. The semiconductor device of claim 5, wherein said substrate is selected from the group consisting of (1) a semiconductor material; (2) a substrate which comprises a semiconductor material, an insulating layer formed thereon and a semiconductor layer formed on said insulating layer; and (3) an insulating material having a semiconductor layer formed thereon.

7. The semiconductor device of claim 5, wherein said metal element in said dielectric layer is selected from the group consisting of titanium, tantalum and tungsten.

8. The semiconductor device of claim 5, wherein said dielectric layer possesses a relative dielectric constant of at least 200.

9. A semiconductor device comprising:

a substrate;

an integrated circuit and a capacitor formed on said substrate;

said capacitor including a first dielectric layer formed on a diffusion layer of said integrated circuit, said first dielectric layer composed of a non-stoichiometric metal oxide composition in which said metal is in excess of stoichiometric composition; a second dielectric layer formed on said first dielectric layer; and a top electrode formed on said second dielectric layer wherein said metal reacts with a spontaneous oxide film formed on the diffusion layer to form a diffusion barrier, thereby reducing the diffusion of components of said substrate into the second dielectric layer.

10. A semiconductor device comprising:

a substrate;

an integrated circuit and a capacitor formed above said substrate;

said capacitor including a dielectric layer formed on a diffusion layer of said integrated circuit, said dielectric layer being an oxide composition containing a metal element and possessing a compositional distribution in which a portion of said dielectric layer which is in contact with said diffusion layer contains an amount of said metal element in excess of an amount of said metal element in a remaining portion of the dielectric layer, said remaining portion having a stoichiometric composition; and a top electrode formed on said dielectric layer wherein the metal element in the portion of the dielectric layer which is in contact with the diffusion layer reacts with a spontaneous oxide film formed on the diffusion layer to form a diffusion barrier, thereby reducing the diffusion of components of said substrate into the remaining portion of said dielectric layer.

* * * * *